United States Patent
Mulder et al.

(10) Patent No.: US 11,421,729 B2
(45) Date of Patent: Aug. 23, 2022

(54) ELASTIC GUIDING DEVICE, POSITIONING DEVICE, BLADE AND LITHOGRAPHIC APPARATUS

(71) Applicant: ASML Netherlands B.V., Veldhoven (NL)

(72) Inventors: Erwin Andreas Bernardus Mulder, Nieuwegein (NL); Krijn Frederik Bustraan, Eindhoven (NL); Antonius Franciscus Johannes De Groot, Lierop (NL); Rinze Koolstra, Culemborg (NL); Paul Peter Anna Antonius Brom, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/421,694

(22) PCT Filed: Dec. 12, 2019

(86) PCT No.: PCT/EP2019/084979
§ 371 (c)(1),
(2) Date: Jul. 8, 2021

(87) PCT Pub. No.: WO2020/143993
PCT Pub. Date: Jul. 16, 2020

(65) Prior Publication Data
US 2022/0082126 A1    Mar. 17, 2022

(30) Foreign Application Priority Data

Jan. 11, 2019  (EP) ..................................... 19151307
Oct. 8, 2019  (EP) ..................................... 19201930

(51) Int. Cl.
*F16C 11/12*    (2006.01)
*G03F 7/20*    (2006.01)

(52) U.S. Cl.
CPC .......... *F16C 11/12* (2013.01); *G03F 7/70716* (2013.01); *G03F 7/70766* (2013.01); *F16C 2370/00* (2013.01)

(58) Field of Classification Search
CPC .. F16C 11/12; F16C 2370/00; G03F 7/70716; G03F 7/70766
See application file for complete search history.

(56) References Cited

U.S. PATENT DOCUMENTS

2002/0194926 A1    12/2002    Awtar et al.
2005/0103967 A1    5/2005    Galburt et al.
(Continued)

FOREIGN PATENT DOCUMENTS

JP    2002-093693 A    3/2002

OTHER PUBLICATIONS

International Search Report and Written Opinion of the International Searching Authority directed to related International Patent Application No. PCT/EP2019/084979, dated Jun. 24, 2020; 18 pages.
(Continued)

*Primary Examiner* — Peter B Kim
(74) *Attorney, Agent, or Firm* — Sterne, Kessler, Goldstein & Fox P.L.L.C.

(57) ABSTRACT

The invention relates to elastic guiding device to support a mass with respect to a base in a support direction, wherein the stiffness in support direction compared to stiffness in other direction, for example the stiffness in vertical direction compared to the stiffness in horizontal directions is substantially increased. The invention further relates to a positioning device comprising at least one elastic guiding device, and a lithographic apparatus comprising such positioning device.

13 Claims, 10 Drawing Sheets

(56) References Cited

U.S. PATENT DOCUMENTS

2007/0221418 A1* 9/2007 Meyer .................. G01M 9/062
                                                        177/171
2018/0112737 A1 4/2018 Runge

OTHER PUBLICATIONS

International Preliminary Report on Patentability directed to related International Patent Application No. PCT/EP2019/084979, dated Jun. 16, 2021; 13 pages.

* cited by examiner

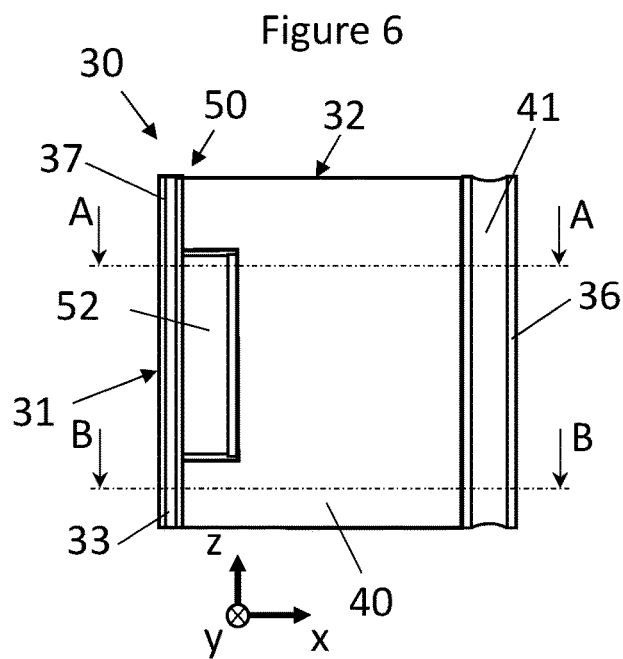
Figure 6
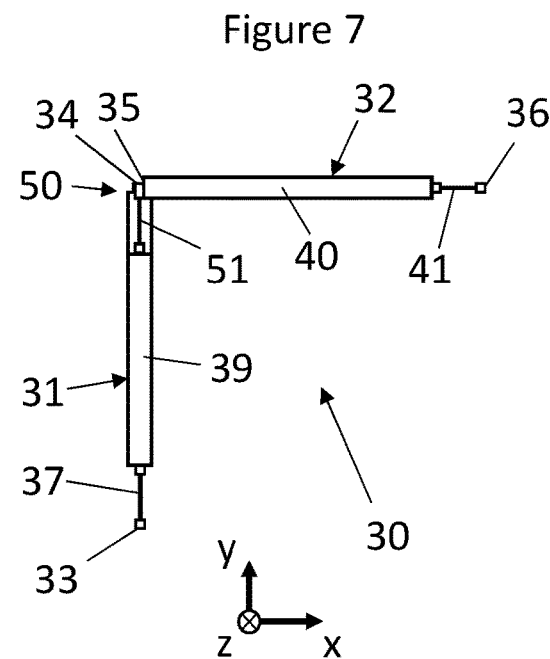
Figure 7
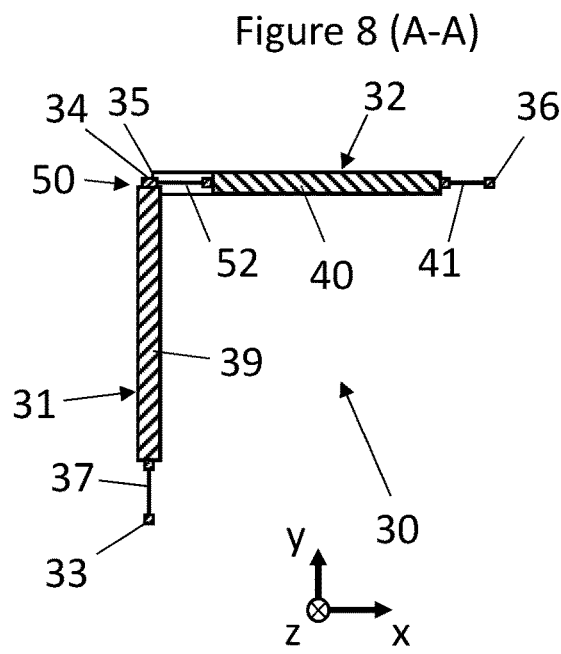
Figure 8 (A-A)
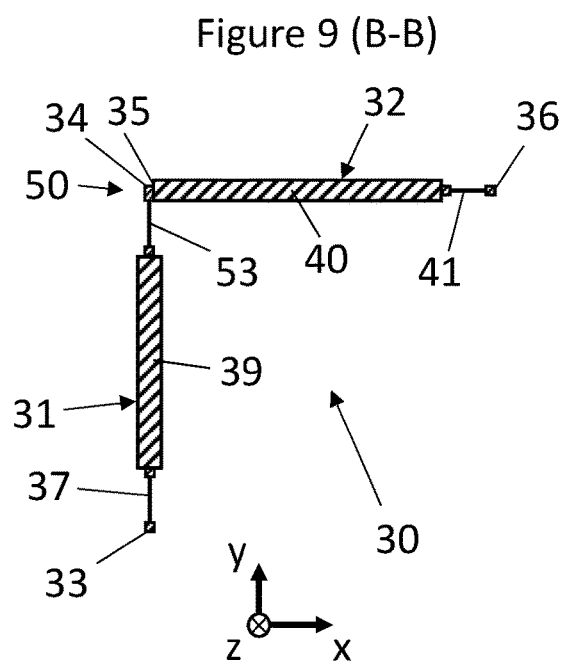
Figure 9 (B-B)

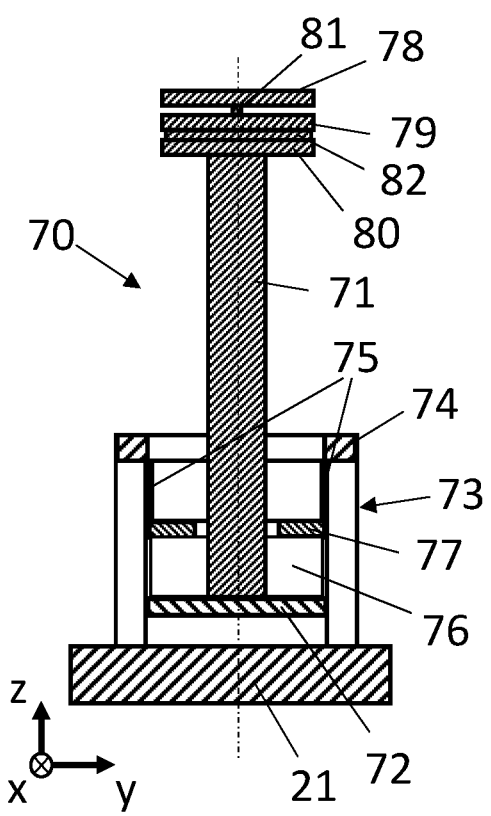
Figure 14 (C-C)
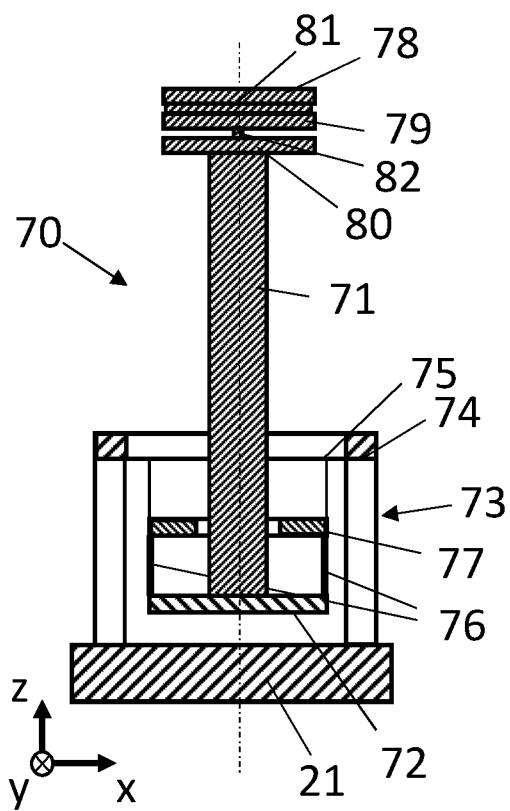
Figure 15 (D-D)

ELASTIC GUIDING DEVICE, POSITIONING DEVICE, BLADE AND LITHOGRAPHIC APPARATUS

CROSS-REFERENCE TO RELATED APPLICATION

The application claims priority of EP application 19151307.6 which was filed on Jan. 11, 2019 and EP application 19201930.5 which was filed on Oct. 8, 2019 which are incorporated herein in its entirety by reference.

FIELD OF THE INVENTION

The present invention relates to an elastic guiding device, a positioning device and a lithographic apparatus comprising such positioning device.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A positioning device may be used to position an object, e.g. a substrate, inside a processing tool, e.g. a lithographic apparatus or an e-beam inspection tool. In an embodiment, the positioning device comprises a movable stage to support the object. An actuator may be provided to move the stage, and the object supported thereon with respect to a reference in a horizontal direction of movement. A balance mass may be arranged between the reference and the actuator. Such balance mass is provided to reduce the transfer of reaction forces from the actuator to the reference. The balance mass may be supported on the reference with a support device which is arranged between the balance mass and the reference.

The balance mass typically moves in a direction of movement opposite to the direction of movement of the stage. This means that when the stage moves for example in positive direction along a horizontal direction, the balance mass will move in the negative direction of the same horizontal direction. Further, the balance mass has typically a mass which is substantially higher than the mass of the stage, for example a mass ratio of 5:1 may be applied. As a result of this difference in mass, there will be an opposite ratio between displacements of the balance mass and the stage in the direction of movement resulting in less displacement of the balance mass compared to the stage while still reducing the transfer of reaction forces to the reference. For example the mass ratio of 5:1 between balance mass and stage will result in a displacement ratio of 1:5 in the direction of movement.

A support device to support the balance mass may comprise multiple leaf springs arranged between the reference and the balance mass. During normal operation of the balance mass, the leaf springs provide sufficient stiffness in the vertical direction to support the balance mass in vertical direction to overcome gravity forces. The leaf springs are further designed to have a relatively low stiffness in a horizontal direction of movement of the stage to reduce a disturbance effect of the leaf springs in the direction of movement of the balance mass caused by the stiffness of the leaf springs.

Further, the achievable stroke of the leaf springs may be limited due to stress and fatigue of the material of the leaf springs that occurs during normal operation of the positioning device. Although this stress and fatigue may be reduced by reduction of the mass of the balance mass, this reduction of mass of the balance mass will result in a larger stroke being required for the balance mass in order to follow movements of the stage. The larger stroke may in itself also lead to higher stresses and potential fatigue issues.

SUMMARY OF THE INVENTION

It is an object of the invention to provide an improved elastic guiding device, for example a leaf spring device, that is capable of supporting an increased mass and/or accommodating an increased stroke.

According to an aspect of the invention, there is provided an elastic guiding device to support a mass with respect to a base in a support direction, comprising
a first blade extending in a first plane, and
a second blade extending in a second plane,
wherein the first plane and the second plane both extend in the support direction,
wherein a first side of the first blade is connected to the base and a second side of the first blade, opposite to the first side of the first blade, is connected to a first side of the second blade, and wherein a second side of the second blade, opposite to the first side of the second blade is connected to the mass,
wherein the first blade comprises at least one rigid element and at least one leaf spring element, wherein the at least one leaf spring element extends over a complete length of the first blade in the support direction and wherein the second blade comprises at least one rigid element and at least one leaf spring element, wherein the at least one leaf spring element extends over a complete length of the second blade in the support direction,
wherein the second side of the first blade is connected to the first side of the second blade by a cross flexure.

According to an aspect of the invention, there is provided an elastic guiding device to support a mass with respect to a base in a support direction, comprising
a first blade extending in a first plane, and
a second blade extending in a second plane,
wherein the first plane and the second plane both extend in the support direction,
wherein a first side of the first blade is connected to the base and a second side of the first blade, opposite to the first side of the first blade, is connected to a first side of the second blade, and wherein a second side of the second blade, opposite to the first side of the second blade is connected to the mass, wherein at least one of the first blade and the second blade comprises a first rigid element and a second rigid element, both extending in support direction over a complete length of the first blade and/or second blade, respectively, and at least two parallel leaf spring elements each extending between the first rigid element and the second rigid element.

According to an aspect of the invention, there is provided an elastic guiding device to support a mass with respect to a base in a support direction, comprising at least one leaf spring element, wherein the at least one leaf spring element extends in the support direction, wherein the at least one leaf spring element comprises in the support direction a bottom end and a top end, wherein at least one of the bottom end and the top end comprises a rounded recess to reduce stress peaks in the material of the at least one leaf spring element at the bottom end and top end, respectively.

According to an aspect of the invention, there is provided an elastic guiding device to support a mass with respect to a base in a support direction, comprising a supporting rod extending in a support direction, an intermediate support element, wherein an upper end of the supporting rod is connected to the mass and a lower end of the supporting rod is supported on the intermediate support element, and a suspension device mounted on the base and arranged to suspend the intermediate support element and to allow movement of the intermediate support element in at least a first direction perpendicular to the support direction.

According to an aspect of the invention, there is provided a blade, for use in an elastic support device, the blade extending in a plane and comprising:

a first interface for connecting the blade to a first structure;

a second interface for connecting the blade to a second structure;

a first leaf spring element, a rigid element and a second leaf spring element, whereby the first leaf spring is arranged to connect the first interface to a first side of the rigid element, whereby the second leaf spring is arranged to connect the second interface to a second, opposite, side of the rigid element, and whereby at least one of the leaf springs has a longitudinal axis that is inclined over a non-zero angle relative to a support direction of the elastic support device.

According to an aspect of the invention, there is provided a positioning device configured to displace an object, comprising:

a stage to support the object, an actuator to move the stage with respect to a reference in a direction of movement, a balance mass arranged between the actuator and the reference to reduce transfer of reaction forces from the actuator to the reference, a support device arranged between the reference and the balance mass to support the balance mass, wherein the support device comprises at least one elastic guiding device according to the invention.

According to an aspect of the invention, there is provided a lithographic apparatus comprising a positioning device according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 shows a side view of a second embodiment of an elastic guiding device;

FIG. 7 shows a top view of the second embodiment of FIG. 6;

FIG. 8 shows a cross-section A-A of the second embodiment of FIG. 6;

FIG. 9 shows a cross-section B-B of the second embodiment of FIG. 6;

FIG. 14 shows a cross section C-C of the fourth embodiment of FIG. 12; and

FIG. 15 shows a cross section D-D of the fourth embodiment of FIG. 12.

DETAILED DESCRIPTION

Figure 1:
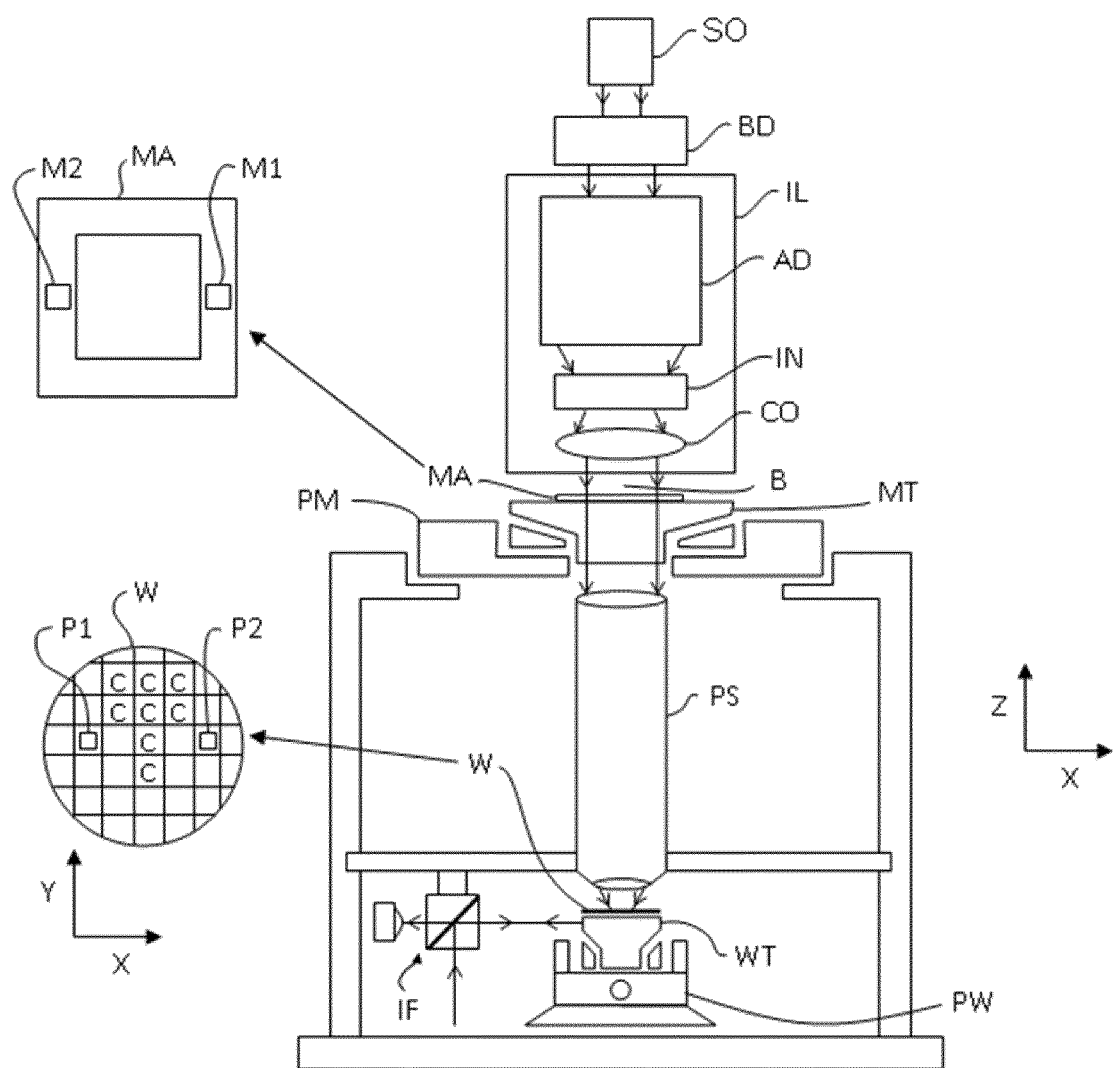
FIG. 1 depicts a lithographic apparatus in which embodiments of the invention may be provided.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS.

Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement.

The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
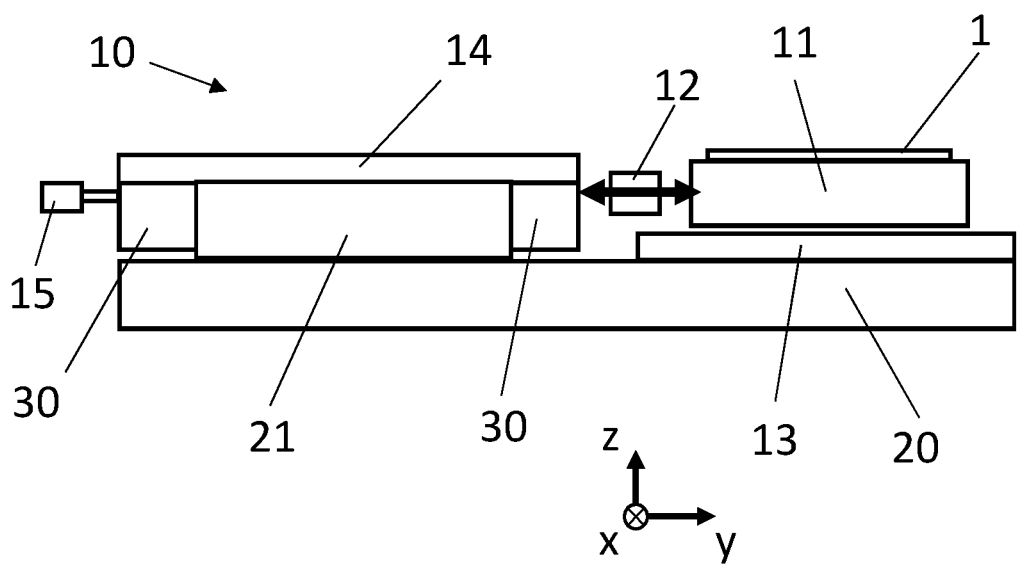
FIG. 2 schematically depicts an embodiment of a positioning device.

FIG. 2 schematically depicts an embodiment of a positioning device 10. This positioning device 10 comprises a stage 11 arranged to support an object 1, for example a substrate or wafer. Actuators 12 are provided to move the stage 11, and therewith the object 1, with respect to a reference 20 in a horizontal direction of movement y.

The stage 11 is supported by a linear or planar bearing 13, for example a magnetic bearing with permanent magnets or electromagnets, an air bearing or a roller bearing. The planar bearing 13 supports the stage 11 in vertical direction (z-direction) without stiffness or with a relatively very low stiffness in the direction of movement y.

A balance mass 14 is arranged between the actuators 12 and the reference 20 to reduce transfer of reaction forces from the actuators 12 to the reference 20. The reference 20 is for example a frame, such as a base frame or a metrology frame of a lithographic apparatus.

When the stage 11 is actuated by the actuators 12 to move the stage 11 in the positive y-direction (e.g. to the right in FIG. 2), the balance mass 14 will move, due to the reaction forces of the actuators 12, in the negative y-direction (e.g. to the left in FIG. 2). Typically, the mass of the balance mass 14 is substantially larger than the mass of the stage 11, for example with a mass ratio of 5:1. As a result of this difference in mass, the displacement of the balance mass 14 in the negative y-direction will be substantially smaller than the displacement of the stage 11 in the positive y-direction. For example, with a mass ratio of 5:1 between the mass of the balance mass 14 and the mass of the stage 11, the displacement ratio between displacement of the balance mass 14 and the displacement of the stage 11 will be 1:5.

Figure 3:
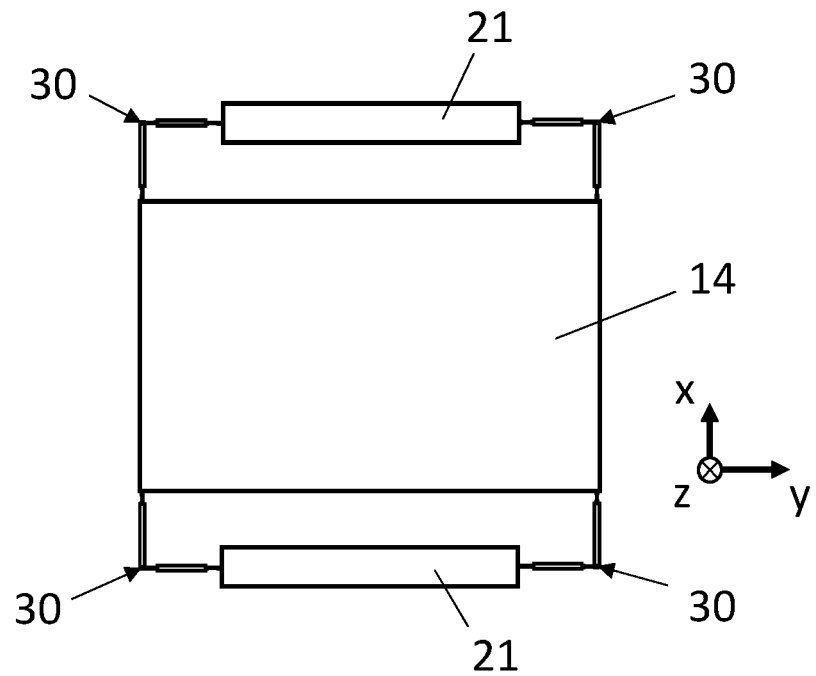
FIG. 3 shows schematically a top view of a balance mass and the elastic guiding devices supporting the balance mass.

The balance mass 14 is supported by a support system comprising multiple elastic guiding devices 30 between the balance mass 14 and a base 21 mounted on the reference 20. FIG. 3 shows a top view of the balance mass 14 and the elastic guiding devices 30 supporting the balance mass 14.

The multiple elastic guiding devices 30 are constructed to support the balance mass 14 in vertical z-direction, i.e. the multiple elastic guiding devices 30 provide a gravitational support force to counteract a gravity force exerted on the balance mass 14. To provide the lifting force during normal operation in the vertical z-direction, the elastic guiding devices 30 have a suitable stiffness in the z-direction.

To accommodate movement of the balance mass 14 in the direction of movement y, the elastic guiding devices 30 should allow a displacement of the balance mass 14 in the direction of movement y. The elastic guiding devices 30 are therefore designed to have a relatively low stiffness in the direction of movement y of the balance mass 14. This relatively low stiffness of the elastic guiding devices 30 in the horizontal direction of movement is provided to transfer minimal reaction forces of the actuators 12 in the direction of movement to the reference 20. However, the elastic guiding devices 30 will have some stiffness in the direction of movement y.

The stiffness in y-direction multiplied by the displacement in the direction of movement y results in a static disturbance force on the balance mass 14. A balance mass actuator 15 may be provided to keep, when required, the balance mass 14 in a position within the range of movement, in particular to prevent that the balance mass 14 returns to the central position as a result of this static disturbance force of the elastic guiding devices 30. The balance mass actuator 15 is typically an actuator with no or very low stiffness in the direction of movement y of the balance mass 14, for example a Lorentz actuator.

To accommodate movement of the balance mass 14 in the x-direction, the elastic guiding devices 30 may also allow a displacement of the balance mass 14 in the x-direction. The elastic guiding devices 30 are therefore also designed to have a relatively low stiffness in the x-direction.

There is a general need to have sufficient stiffness of the elastic guiding devices 30 in z-direction to properly support the balance mass 14, although the need of a high stiffness in z-direction of the elastic guiding devices 30 may be decreased when the mass of the balance mass 14 is reduced. However, such reduced mass of the balance mass 14 will require larger displacements in reaction to displacements of the stage 11. Thereby, the larger stroke will also lead to higher stresses and potential fatigue in the elastic guiding devices 30.

When reduction of the mass of the balance mass 14 is undesirable or even an increase in mass of the balance mass 14 may be needed, the stiffness of the elastic guiding devices 30 in z-direction may also need to be increased. The stiffness of the elastic guiding devices 30 in x-direction and/or y-direction should not increase when increasing the stiffness of the elastic guiding devices 30 in z-direction, or should at least stay below a certain maximum stiffness level to avoid that the stiffness in x-direction and/or y-direction has a negative effect on performance of balance mass movements. Thus, it may be desirable to increase the stiffness ratio between stiffness in z-direction and stiffness in the x-direction and/or y-direction of the elastic guiding devices 30.

Figure 4:
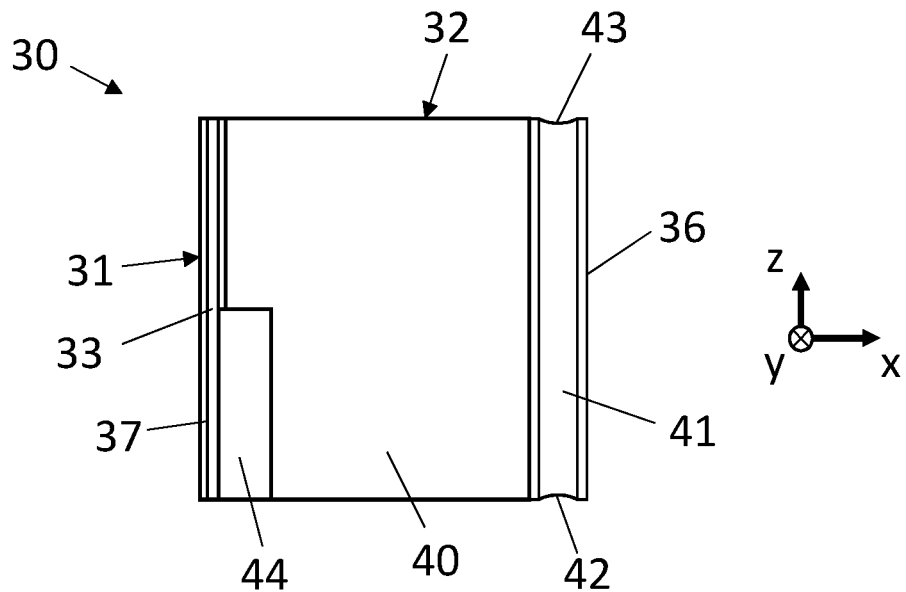
FIG. 4 shows a side view of a first embodiment of an elastic guiding device.
Figure 5:
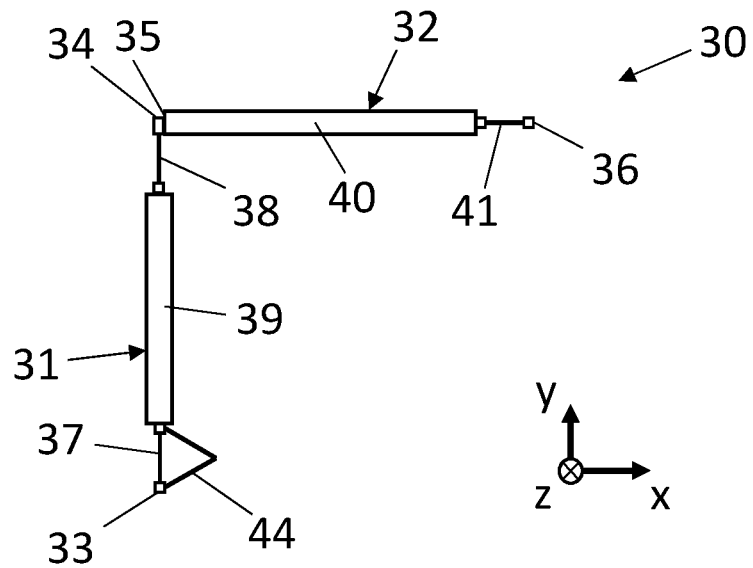
FIG. 5 shows a top view of the first embodiment of FIG. 4.

FIGS. 4 and 5 show a side view and a top view of a first embodiment of an elastic guiding device 30 according to an aspect of the invention, respectively. The elastic guiding device 30, shown in FIGS. 4 and 5, comprises a first blade 31 extending in the y-z plane, and a second blade 32 extending in the x-z plane. In FIGS. 4 and 5 the elastic guiding device 30 is shown in an unloaded state, in which the first blade 31 and the second blade 32 extend in perpendicular planes and no forces are exerted on the elastic guiding device 30. When a force is exerted on the elastic guiding device 30, the first blade 31 and/or the second blade 32 may bend. As a result, the angle between the first blade 31 and the second blade 32 may also change, for example between 85 degrees and 95 degrees with respect to each other.

The shown embodiment of FIGS. 4 and 5 is configured to be arranged at two opposite corners of the balance mass 14, e.g. the upper right and the lower left corner of FIG. 3, while the configuration of the elastic guiding devices 30 at the two other corners will be mirrored in the x-z plane with respect to the embodiment shown in FIGS. 4 and 5.

A first side 33 of the first blade 31 is configured to be mounted to the base 21, and a second side 34 of the first blade 31, opposite to the first side 33, is connected to a first side 35 of the second blade 32. A second side 36 of the second blade 32, opposite to the first side 34 is configured to be mounted to the balance mass 14.

The first blade 31 comprises at its first side 33 a first leaf spring element 37 and at its second side 34 a second leaf spring element 38. Between the first leaf spring element 37 and the second leaf spring element 38 a first rigid plate element 39 is provided. The first leaf spring element 37, the second leaf spring element 38 and the first rigid plate element 39 extend over the complete height of the first blade 31, i.e. over the complete length of the first blade 31 in z-direction.

The second blade 32 comprises at its first side 35 a second rigid plate element 40 that is connected to the second leaf spring element 38 of the first blade 31. At the second side 36 of the second blade 32, a third leaf spring element 41 is provided that is connected to the second rigid plate element 40 and configured to be mounted to the balance mass 14. The third leaf spring element 41 and the second rigid plate element 40 extend over at least part of the height of the second blade 32, i.e. over at least part of the length of the first blade 32 in z-direction. The third leaf spring element 41 and the second rigid plate element 40 may extend over the complete height of the second blade 32, i.e. over the complete length of the first blade 32 in z-direction.

As the elastic guiding device 30 comprises one or more leaf spring elements, the elastic guiding device 30 may also be indicated as a leaf spring device. The elastic guiding device 30 is constructed to provide a relatively high stiffness in z-direction, e.g. vertical direction, to support the balance mass 14, and a relatively low stiffness in x-direction and y-direction to allow movements in these horizontal directions. The range of movement of the balance mass 14 is for example 20 to 80 mm in the x-direction and 40 to 160 mm in the y-direction. These movements have to be facilitated by the elastic guiding devices 30.

Rigid plate elements, such as the first rigid plate element 39 and the second rigid plate element 40 are designed to provide a high stiffness in all six degrees of freedom. Leaf spring elements, such as the first leaf spring element 37, the second leaf spring element 38 and the third leaf spring element 41 may be designed as plate elements that provide a relatively high stiffness in the plane in which the plate element extends and a relatively low stiffness in a direction perpendicular to the plane in which the plate element extends.

The third leaf spring element 41 comprises in the z-direction a bottom end 42 and a top end 43, wherein each of the bottom end 42 and the top end 43 comprises a rounded recess to reduce stress peaks in the material of the third leaf spring element 41 at the bottom end 42 and top end 43, respectively. Due to these rounded recesses in the bottom end 42 and the top end 43 the stress levels in the third leaf spring element 41, in particular at the bottom end 42 and the top end 43 can be substantially reduced. This results in a higher reliability of the elastic guiding device 30, i.e. the risk of failure of the third leaf spring element 41 due to fatigue is substantially reduced.

In an embodiment, the first leaf spring element 37 and the second leaf spring element 38 may also comprise at the bottom end 42 and/or the top end 43 a rounded recess designed to reduce the stress levels in the respective bottom end 42 and/or top end 43.

The elastic guiding device 30 shown in FIGS. 4 and 5 further comprises a torsion reinforcement element 44 associated with the first leaf spring element 37. The torsion reinforcement element 44 is arranged to at least partially prevent torsion of the first leaf spring element 37. The torsion reinforcement element 44 comprises two leafs that are connected at a sharp angle with respect to each other, wherein one leaf is mounted to one side of the first leaf spring element 37 and the other leaf is mounted to the other side of the first leaf spring element 37. The torsion reinforcement element 44 improves the resistance of the first leaf spring element 37 against torsion effects.

Similar torsion reinforcement elements may be used with other leaf spring elements 38, 41 to at least partially prevent torsion of the respective leaf spring element. The torsion reinforcement element 44 shown in FIGS. 4 and 5 only extends over a lower part of the height of the first leaf spring element 37. In other embodiments, the torsion reinforcement element 44 may extend over the complete height of the leaf spring element, or over other parts of the respective leaf spring element.

FIGS. 6 and 7 show, in an unloaded state, a side view and a top view of a second embodiment of an elastic guiding device 30 according to an aspect of the invention, respectively. The elastic guiding device 30 comprises a first blade 31, extending between a first side 33 and a second side 34 of the first blade 31, and a second blade 32 extending between a first side 35 and a second side 36 of the second blade 32. The first side 33 of the first blade 31 is configured to be mounted to the base 21, and the second side 36 of the second blade 32 is configured to be connected to the balance mass 14.

The first blade 31 comprises at its first side 33 a first leaf spring element 37, similar to the first leaf spring element 37 of the embodiment of FIGS. 4 and 5. The second blade 32 comprises at its second side 36 a second leaf spring element 41 similar to the third leaf spring 41 of the embodiment of FIGS. 4 and 5. The first leaf spring element 37 is connected to a first rigid plate element 39 of the first blade 31 and the second leaf spring element 41 is connected to the second rigid plate element 40 of the second blade 32.

The first blade 31 and the second blade 32 are connected to each other by a cross flexure 50. The cross flexure 50 comprises an upper leaf spring element 51, a middle leaf spring element 52, and a lower leaf spring element 53.

FIG. 8 shows a cross-section A-A and FIG. 9 shows a cross section B-B of this second embodiment of the elastic guiding device 30. The cross section A-A intersects the middle leaf spring element 52 and the cross section B-B intersects the lower leaf spring element 53.

The upper leaf spring element 51 and the lower leaf spring element 53 are arranged in the first blade 31 and therefore extend in the y-z plane. The middle leaf spring element 52 is arranged in the second blade 32 and extends in the x-z plane. The upper leaf spring element 51, the middle leaf spring element 52, and the lower leaf spring element 53 are arranged between the first rigid plate element 39 of the first blade 31 and the second rigid plate element 40 of the second blade 32. Recesses are arranged in the first rigid plate element 39 and the second rigid plate element 40 to accommodate the upper leaf spring element 51, the middle leaf spring element 52, and the lower leaf spring element 53.

It has been found that the provision of a cross flexure 50 in the elastic guiding device 30 substantially increases the stiffness in the z-direction without a corresponding increase in the stiffness in the x-direction and/or y-direction.

The cross flexure 50 of FIGS. 6 to 9 comprises three leaf spring elements 51, 52, 53 arranged between the first rigid plate element 39 and the second rigid plate element 40. More generally, a cross flexure is a flexure construction in which two bodies, for example two rigid bodies, are connected to each other by at least two leaf spring elements, i.e. both leaf spring elements are connected at one side to one body and at the other side to the other body, and wherein the at least two leaf spring elements extend in two different directions, for example two perpendicular directions. In an embodiment, in which the two bodies extend in two perpendicular directions, the cross flexure may for example comprise one leaf spring element parallel to a direction in which one body extends and the other leaf spring element parallel to a direction in which the other body extends.

Figure 10:
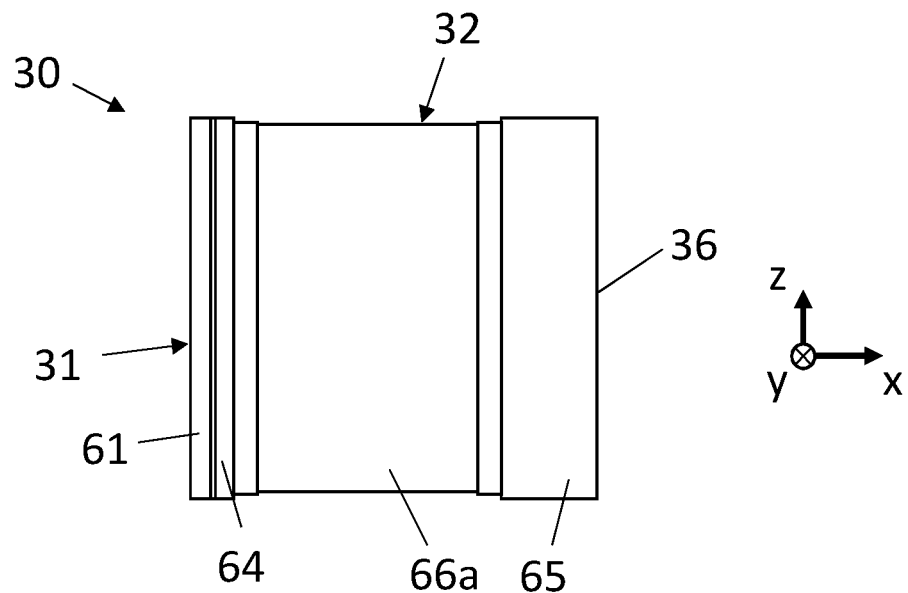
FIG. 10 shows a side view of a third embodiment of an elastic guiding device.
Figure 11:
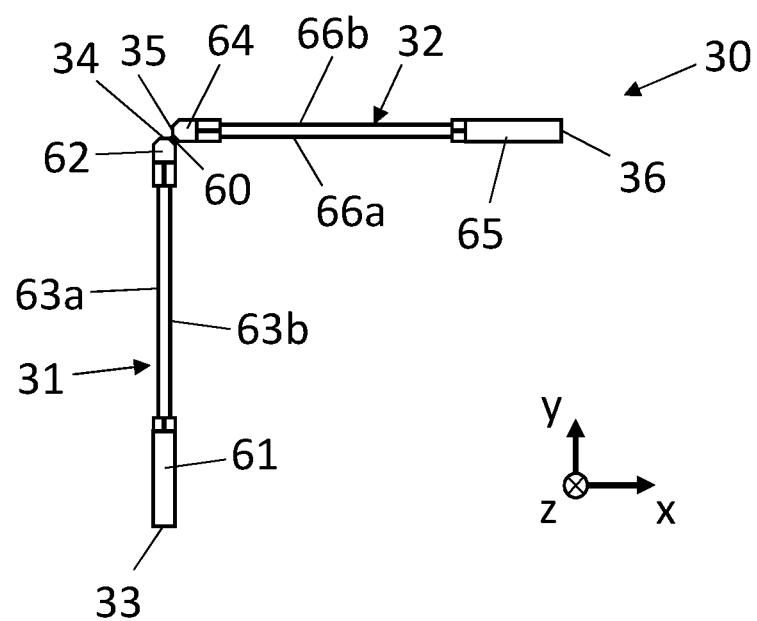
FIG. 11 shows a top view of the third embodiment of FIG. 10.

FIGS. 10 and 11 show, in an unloaded state, a side view and a top view of a third embodiment of an elastic guiding device 30 according to an aspect the invention, respectively. The elastic guiding device 30 comprises a first blade 31 extending in the y-z plane between a first side 33 and a second side 34, and a second blade 32 extending in the x-z plane between a first side 35 and a second side 36. The first blade 31 and the second blade 32 are connected to each other by a notch flexure 60 between the second side 34 of the first blade 31 and the first side 35 of the second blade 32. The notch flexure 60 provides a relatively thin solid connection between the first blade 31 and the second blade 32 that extends in the z-direction over substantially the complete height of the elastic guiding device 30. The notch flexure 60 allows a rotation Rz around the z-axis between the first blade 31 and the second blade 32. The range of rotation provided by the notch flexure 60 may for example be 0.5 degrees to 4 degrees in Rz direction.

The first blade 31 comprises a first rigid element 61 at its first side 33 and a second rigid element 62 at its second side 34. Between the first rigid element 61 and the second rigid element 62 two parallel leaf spring elements 63*a*, 63*b* are arranged that are each connected to the first rigid element 61 and the second rigid element 62. Correspondingly, a third rigid element 64 is arranged at the first side 35 of the second blade and a fourth rigid element 65 is arranged at the second side 36 of the second blade 32. Between the third rigid element 64 and the fourth rigid element 65, two parallel leaf spring elements 66*a*, 66*b* are provided that are each connected to the third rigid element 64 and the fourth rigid element 65.

The advantage of the parallel leaf spring elements is that the parallel leaf spring elements 63*a*, 63*b* and 66*a*, 66*b* provide a relative large stiffness in the plane in which the leaf spring elements extend and a relatively low stiffness in the direction perpendicular to the plane in which the leaf spring element extend. This means that the leaf spring elements 63*a*, 63*b* of the first blade 31 may provide a high stiffness in the z direction and y direction, but a low stiffness in the x-direction. Correspondingly, the parallel leaf spring element 66*a*, 66*b* of the second blade 32 may provide a relatively high stiffness in the z-direction and the x-direction, but a low stiffness in the y-direction.

The parallel leaf spring elements of the elastic guiding device 30 of FIGS. 10 and 11 therefore provide a lower stress level for XY-movements and a lower out-of-plane stiffness for a given stroke and a given minimum vertical stiffness/in-plane stiffness. The latter is related to BM mass and dynamic performance.

In the embodiment of FIGS. 10 and 11 each of the first blade 31 and the second blade 32 comprises two parallel leaf spring elements. In alternative embodiments, only one of the first blade 31 and the second blade 32 may be provided with parallel leaf spring elements. Also three or more parallel leaf spring elements may be provided in one or more of the blades of the leaf spring elements to further improve the ratio between the stiffness in the plane of the leaf spring elements with respect to the stiffness perpendicular to the plane of the leaf spring elements. It can further be pointed out that the parallel leaf spring elements 63*a*, 63*b* or 66*a*, 66*b* may have a varying thickness along the y-direction resp. x-direction. In particular, the leaf spring elements may have a cross-section having a varying thickness as e.g. illustrated below in FIG. 16. Alternatively, the thickness of the parallel leaf-spring elements as applied may be larger in a center part of the leaf spring element. By doing so, the leaf spring element can be made stronger. The variation of the thickness along the y-direction or x-direction may either be continuous or discreet, i.e. step-wise. It can further be pointed out that the application of parallel leaf spring elements to form a blade such as blades 31 and 32 may advantageously be applied in the embodiments of FIGS. 2-9. In particular the rigid plate elements 39 and 40 described above may be replaced by a parallel leaf spring arrangement comprising two or more parallel leaf spring elements. In such an arrangement, the parallel leaf spring elements can e.g. be kept apart by means of rigid elements such as elements 61, 62, 64 or 65. In such an arrangement, leaf spring elements such as leaf spring elements 37, 38 or 41 can be applied to connect rigid element 61 to the base, to connect rigid elements 62 and 64 and to connect rigid element 65 to the balance mass respectively.

Figure 16:
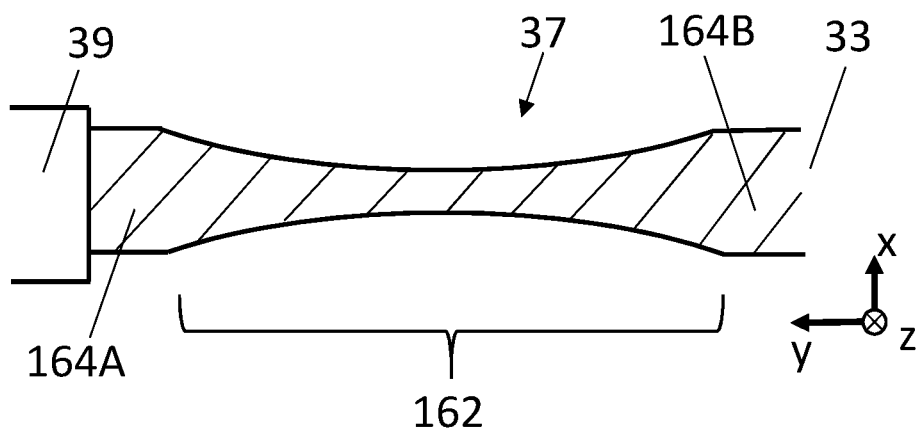
FIG. 16 shows a cross section A-A according to an embodiment of the invention.

The embodiments as described in FIGS. 2-15 can be provided with a leaf spring element as shown in FIG. 16. FIG. 16 shows a cross-section of the first leaf spring element 37 along (A-A). The cross-section is perpendicular to the support direction, which is the z-direction in this embodiment. The cross-section has a center part 162 and two end parts 164A and 164B. The center part 162 is in between the two end parts 164A and 164B. The center part 162 is thinner than the two end parts 164A, 164B. This means that a thickness of the leaf spring element 37 is less in the center part 162 than a thickness of the leaf spring element 37 in the two end parts 164A, 164B. For example, the thickness of the center part 162 may be 0.5 or 0.3 or 0.1 or 0.01 of the thickness of the two end parts 164A, 164B. The center part 162 may be extending from one of the two end parts 164A, 164B to the other of the two end parts 164A, 164B. End part 164A may be coupled to the first rigid plate element 39. End part 164B may be adjacent to the first side 33. As shown in FIG. 16, the center part 162 is curved. The curve may help to reduce stress in the first leaf spring element 37. The center part 162 may be curved in a shape of a part of a circle. Alternatively, the center part 162 may be curved in the shape of a parabola or an ellipse. In FIG. 16, the first leaf spring element 37 is shown. However, the cross-section and curved center part 162 may be applied to one or more of the first leaf spring element 37, the second leaf spring element 38, the third leaf spring element 41, the upper leaf spring element 51, the middle leaf spring element 52, the lower leaf spring element 53, or any other leaf spring element. In an embodiment of the present invention, the leaf spring element or leaf spring elements as applied may thus have a varying thickness. In particular, the thickness may varied such that the thickness in a center part of the leaf spring element is smaller than in an end part of the leaf spring element. In case more than one leaf spring element is applied, the thickness and/or the thickness variation of each leaf spring element may be different. As an example, the leaf spring elements 37, 38 and 41 of the embodiment shown in FIG. 5 may each have a dedicated thickness and thickness variation.

Figure 17:
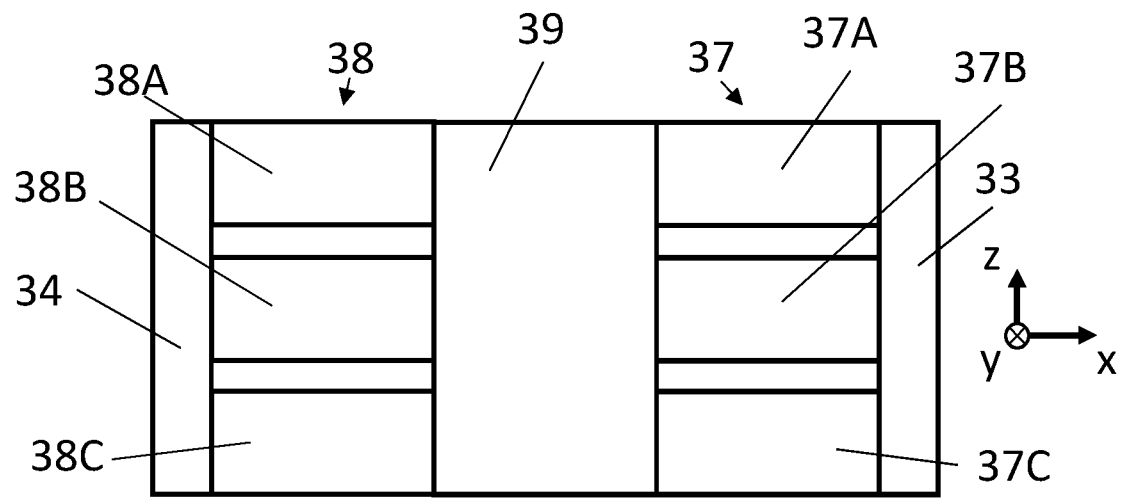
FIG. 17 shows a side view of a further embodiment of the invention.

The first leaf spring element 37 may be divided into a plurality of sub-elements, as shown in FIG. 17. The sub-elements are arranged along the support direction (z). The sub-elements 37A, 37B, 37C are separated from each other along the support direction. The first leaf spring element 37 is divided into 3 sub-elements 37A, 37B, 37C. In an embodiment, there are 2 sub-elements, or there are more than 3 sub-elements. By dividing the first leaf spring element 37 into the plurality of sub-elements 37A, 37B, 37C, the stress on the leaf spring element 37 may be reduced. One side of the sub-elements 37A, 37B, 37C is on the first side 33. At the opposite side, the sub-elements 37A, 37B, 37C are coupled to the first rigid plate element 39. At one or more ends, the sub-elements 37A, 37B, 37C may be coupled to each other via one or more intermediate bodies. One of the intermediate bodies may be connected to the first rigid plate element 39. Similarly to the first leaf spring element 37, the second leaf spring element 38 may be divided into a plurality of sub-elements 38A, 38B, 38C. The sub-elements 38A, 38B, 38C are arranged along the support direction (z). The sub-elements 38A, 38B, 38C are separated from each other along the support direction. The second leaf spring element 38 is divided into 3 sub-elements 38A, 38B, 38C. In an embodiment, there are 2 sub-elements, or there are more than 3 sub-elements.

In FIG. 17, the first leaf spring element 37 and the second leaf spring element 38 are shown. However, the sub-elements may be applied to one or more of the first leaf spring element 37, the second leaf spring element 38, the third leaf spring element 41, the upper leaf spring element 51, the middle leaf spring element 52, the lower leaf spring element 53, or any other leaf spring element. It can further be pointed out that, in case a leaf spring element is applied that comprises multiple sub-elements, said sub-elements may have different dimensions or material characteristics. In particular, the sub-elements need not to have the same height or width or thickness, nor need they be made from the same materials. It can further be pointed out that the gaps between adjacent sub-elements need not have the same dimensions either. Referring to FIG. 17, the gap, in the z-direction, between sub-element 37A and sub-element 37B thus not need to be the same as the gap, in the z-direction, between sub-element 37B and sub-element 37C. In case the elastic guiding device according to the invention includes multiple leaf spring elements that are subdivided, the subdivisions as applied can be different for the different leaf spring elements.

Figure 12:
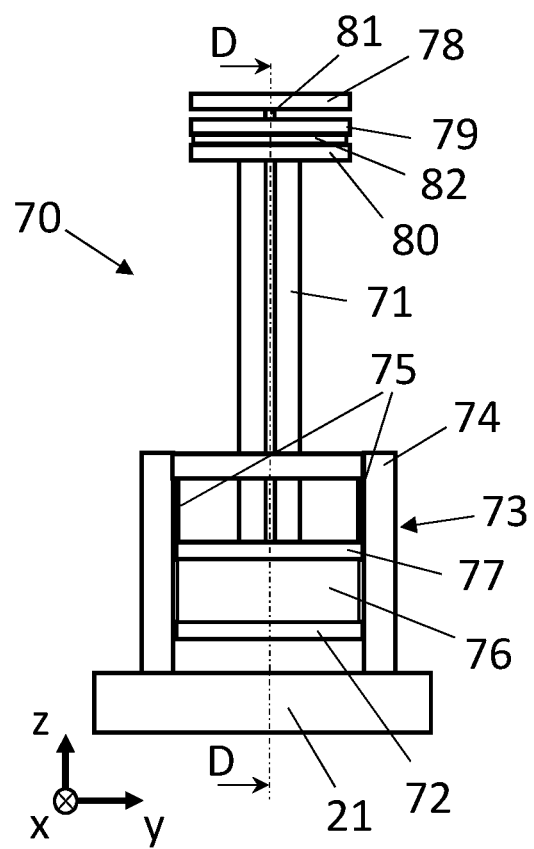
FIG. 12 shows a first side view of a fourth embodiment of an elastic guiding device.
Figure 13:
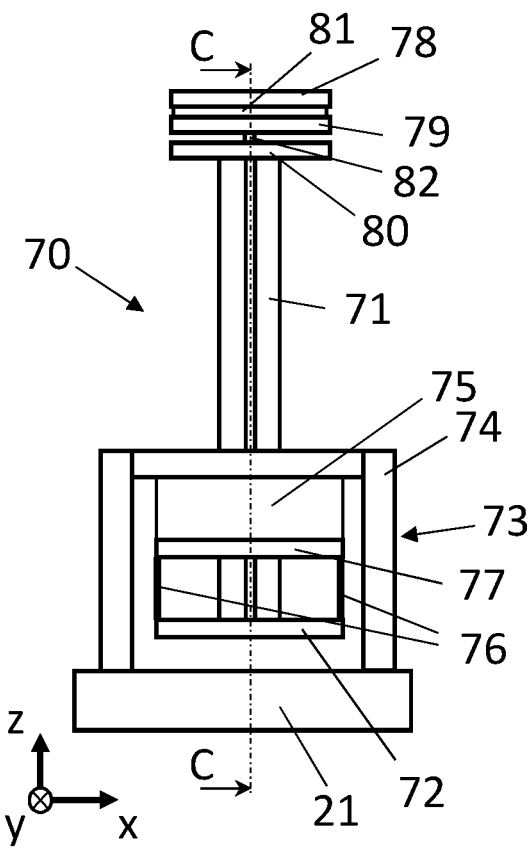
FIG. 13 shows a second side view of the fourth embodiment of FIG. 12.

FIGS. 12 and 13 show two side views of a fourth embodiment of an elastic guiding device 70 according to an aspect of the invention. FIG. 14 shows a cross section C-C and FIG. 15 shows a cross section D-D of the elastic guiding device 70.

In this embodiment an inverse pendulum is used to support a mass, for example a balance mass at least partially in a support direction. The support direction is in the shown embodiment the z-direction. The elastic guiding device 70 comprises a supporting rod 71 extending in the support direction. The elastic guiding device 70 further comprises a plate shaped intermediate support element 72. An upper end of the supporting rod 71 is arranged to be connected to a mass, for example a balance mass. The lower end of the supporting rod 71 is supported on the intermediate support element 72. A suspension device 73 is provided to hold the intermediate support element 72 in a suspended position to support the mass connected at the upper end of the supporting rod 71 and to allow movement of the intermediate support element in at least the x-direction and the y-direction.

Since an inverse pendulum as formed by the elastic guiding device 70 may have a low stability, stabilizing elements, such as passive or active underconstraint-eliminators, may be provided to increase the stability of the elastic guiding device 70.

The suspension device 73 comprises a suspension frame 74 to be mounted on the base 21. The suspension device 73 further comprises a first pair of leaf spring elements 75 and a second pair of leaf spring elements 76 and a support plate 77 having a hole through which the supporting rod 71 extends.

The leaf spring elements of the first pair of leaf spring elements 75 extend in the x-z plane and the leaf spring elements of the second pair of leaf spring elements 76 extend in the y-z plane. The first pair of leaf spring elements 75 are suspended from the suspension frame 74, whereby the support plate 77 is mounted at the lower ends of the first pair of leaf spring elements 75. The second pair of leaf spring elements 76 are suspended from the support plate 77, whereby the intermediate support element 72 is mounted on the lower ends of the second pair of leaf spring elements 76.

An advantage of the elastic guiding device 70 shown in FIGS. 12 to 15 is that a sagging of the upper end of the supporting rod 71 due to bending of the supporting rod 71 caused by a movement of the supporting rod in the x-direction and/or y-direction may at least partially be compensated by the suspension device 73. The movement of the supporting rod 71 in the x-direction and/or y-direction will result in a movement of the intermediate support element 72 in the x-direction and/or y-direction. This movement of the intermediate support element 72 in the x-direction and/or y-direction will result in lifting of the intermediate support element 72 with respect to the suspension frame 74. This lifting of the intermediate support element 72 will also lift at least the lower end of the supporting rod therewith at least partially compensating the sagging of the upper end of the supporting rod 71.

At the upper end of the supporting rod 71 an upper plate 78, a middle plate 79 and a lower plate 80 are arranged. Between the upper plate 78 and the middle plate 79 a first notch flexure 81 is provided. The first notch flexure 81 extends in the x-direction, and therefore allows rotation about a first rotation axis extending in the x-direction (Rx). Between the middle plate 79 and the lower plate 80 a second notch flexure 82 is provided. The second notch flexure 82 extends in the y-direction, and therefore allows rotation about a second rotation axis extending in the y-direction (Ry). In case no flexibility in the Rx and/or Ry rotation direction is needed, the first notch flexure 81 and/or the second notch flexure 82 may be omitted.

Further, the supporting rod 71 may be constructed to allow some torsion about its longitudinal axis in order to reduce stiffness of the elastic guiding device 70 in rotation about a rotation axis extending in the z-direction (Rz).

In the embodiments of the elastic guiding devices, such as leaf spring devices as described above, the leaf springs of the blades as applied are arranged such that they enable a rotation about an axis that is parallel to the support direction, e.g. the vertical direction. In order to do so, the leaf springs as applied, e.g. leaf springs 37, 38, 41 of FIGS. 4 and 5, are constructed such that their longitudinal axis extends in the support direction, e.g. the vertical direction. By doing so, the rigid elements of the blades may pivot about the support direction.

Figure 18:
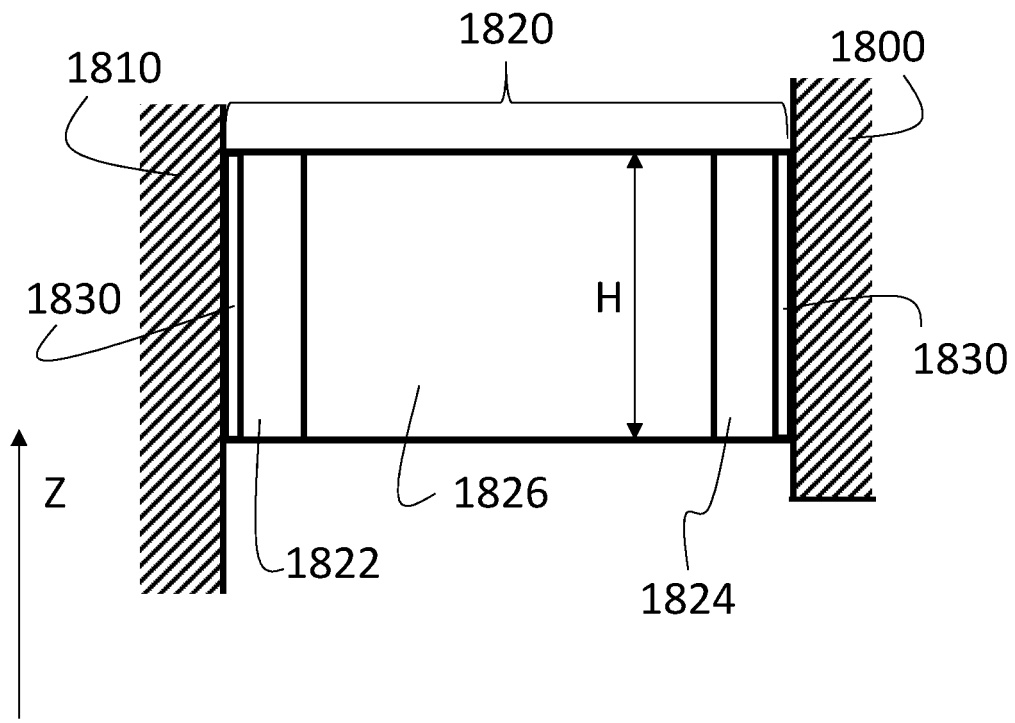
FIGS. 18 and 19 show a side view and top view of a blade known in the art.
Figure 19:
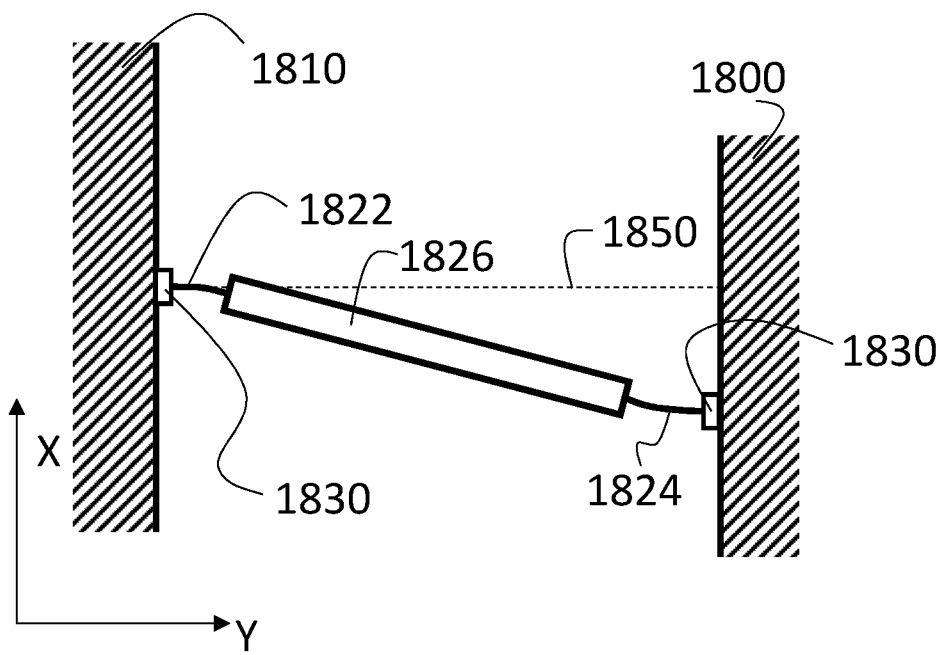

It has been observed however that the application of leaf springs that enable a rotation about an axis parallel to the support direction, may also result in an undesired displacement of the supported object or mass in the support direction. This can be illustrated as follows:

Assuming a blade is applied to support a mass relative to a reference, e.g. a base frame. Such an arrangement is schematically shown in FIG. 18. FIG. 18 schematically shows an object 1800 and a base or base frame 1810, the mass being supported by the base frame 1810 via a blade 1820, the blade 1820 comprises a first leaf spring element 1822, connected to the base 1810 and a second leaf spring element 1824, connected to the object 1800. Between the first leaf spring element 1822 and the second leaf spring element 1824 a first rigid plate element 1826 is provided. Within the meaning of the present invention, a rigid element in general refers to an element or component having a larger or substantially larger stiffness that a leaf spring or leaf spring element. A rigid element or rigid plate element would have, within the meaning of the present invention, a high stiffness in all six degrees of freedom, whereas a leaf spring element would have a low stiffness in at least one degree of freedom. Phrased differently, the characteristic 'rigid' is used to denote that, in case the blade is made to deform, e.g. deflect in a plane perpendicular to the support direction, the deformation primarily takes place in the leaf spring elements, rather than in the rigid element of the blade. Such a rigid element may also be referred to as a reinforced element. It can be acknowledged that in practice all mechanical components may to some extend be deformable and, as such, not be rigid in an absolute sense. As can be seen in FIG. 19, showing a top view of the blade 1820, the leaf spring elements 1822 and 1824 have a reduced thickness compared to the rigid or reinforced plate element 1826, which enables the rigid or reinforced plate element 1826 to pivot about the vertical axis or Z-direction. Note that, in an embodiment, the leaf springs 1822 and/or 1824 may have a cross-section as schematically shown in FIG. 16. In FIGS. 18 and 19, reference number 1830 refers to interfaces 1830 of the blade 1820, enabling the blade 1820 to be connected to the base frame 1810 and the object 1800. Note that such an interface can be an integral part of the blade or a thicker end portion of the leaf springs. In the embodiment as shown, the first leaf spring element 1822, the second leaf spring element 1824 and the first rigid plate element 1826 extend over the complete height H of the blade 1820, i.e. over the complete length of the first blade 1820 in the support direction, i.e. the Z-direction. Phrased differently, in the arrangement as shown, the longitudinal axis 1822.1, 1824.1 of the leaf springs 1822, 1824 extend in the support direction, or is parallel to the support direction, i.e. the Z-direction.

Note that the structure of the blade 1820 as schematically shown in FIG. 18 substantially corresponds to the structure of the blade 31 shown in FIGS. 4 and 5.

When the blade 1820 is used to support a mass or object 1800 in the vertical direction, it can be observed that the blade 1820 will deform in the vertical direction. Due to the weight of the object 1800, the blade will deform such that the object 1800 is lowered. In the embodiment as shown, the blade 1820 may e.g. be considered fixed, in vertical direction, at the left side, i.e. at the connection to the base frame 1810, whereas a force, corresponding to the weight of the object 1800, acts on the blade on the right side. It has further been observed, by means of simulations, that the deformation of the blade in the vertical direction does not remain constant, when the blade is also deflected in the horizontal plane.

As an example, a blade having a length of approx. 400 mm and a height of approx. 200 mm is considered to support an object of e.g. 2000 N. Such a load may e.g. cause a deformation in the vertical direction of e.g. 70 µm when there is no deflection in the horizontal plane, whereas the load may cause a deformation of e.g. 90 µm in the vertical direction when the load is also deflected in the horizontal plane, e.g. deflected over 40 mm in the horizontal direction. An increased vertical displacement of approx. 20 µm thus occurs when a deflection over 40 mm is applied in the horizontal direction between the object 1800 and the base frame 1810.

FIG. 19 schematically shows a top view of the blade 1820 connected between the base frame 1810 and the object 1800, when the object 1800 is displaced, relative to the base frame 1810 in the horizontal direction, in particular in the indicated X-direction. Compared to the position when de blade is in its nominal position, indicated by the dotted lines xx, the deformation of the blade 1820 in the vertical direction is larger when the blade is deflected in the horizontal plane. As such, when an object 1800, e.g. a sensor or a camera or a stage, is displaced in the horizontal direction, it will not displace along a straight line, but rather follow a parabolic-like trajectory in the vertical direction. Within the meaning of the present invention, the varying displacement in the vertical direction or support direction, caused by a displacement in the horizontal direction, is referred to as a parasitic deformation.

It can be pointed out that such a varying deformation of the blade 1820 may be undesired as it results in a variable vertical position of the object, depending on the deflection in the horizontal plane.

It can further be pointed out that the varying vertical deformation is caused by a varying stiffness of the blade while it moves in the horizontal plane.

For the example given above, the stiffness of the blade 1820 is 2000 N/70 μm at the nominal position and 2000 N/90 μm when the blade 1820 is deflected over 40 mm in the horizontal plane.

According to an aspect of the present invention, there is provided an elastic guiding device to support a mass with respect to a base in a support direction, whereby the elastic guiding device includes a blade which enables to mitigate the aforementioned adverse effects. In particular, according to an aspect of the present invention, there is provided an elastic guiding device to support a mass with respect to a base in support direction, the elastic guiding device including a blade extending in a first plane, the blade having a leaf spring element, the leaf spring element having a longitudinal axis that is inclined over a non-zero angle relative to the support direction.

In an embodiment, the longitudinal axis is inclined so as to compensate for a parasitic deformation of the blade in the support direction, when the blade is deflected in a direction perpendicular to the first plane. In an embodiment, the present invention provides in a blade for use in an elastic support device, the blade comprising a first interface for connecting the blade to a first structure and a second interface for connecting the blade to a second structure. The blade further comprising a first leaf spring element, a rigid element and a second leaf spring element, whereby the first leaf spring is arranged to connect the first interface to a first side of the rigid element, whereby the second leaf spring is arranged to connect the second interface to a second, opposite, side of the rigid element, and whereby at least one of the leaf springs has a longitudinal axis that is inclined over a non-zero angle relative to a support direction of the elastic support device.

Figure 20:
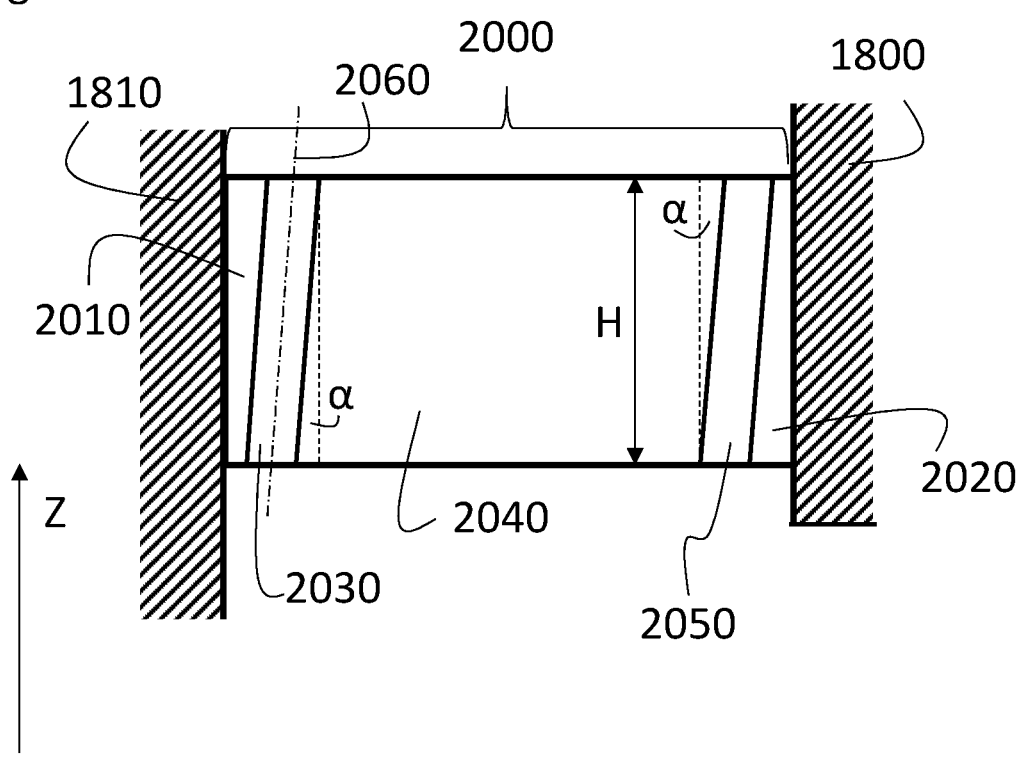
FIG. 20 shows a blade according to an embodiment of the present invention.

Such a blade is schematically shown in FIG. 20. FIG. 20 schematically shows a blade 2000 for use in an elastic support device. In the embodiment as shown, the blade 2000 is arranged between a base frame 1810 and an object 1800, in a similar manner as the blade 1820 shown in FIGS. 18 and 19. In the embodiment as shown, the blade 2000 comprising a first interface 2010 for connecting the blade 2000 to a first structure, i.e. the base or base frame 1810, and a second interface 2020 for connecting the blade 2000 to a second structure, i.e. the object 1800 that is to be supported. The blade further comprising a first leaf spring element 2030, a rigid element 2040 and a second leaf spring element 2050, whereby the first leaf spring 2030 is arranged to connect the first interface 2010 to a first side of the rigid element 2040, whereby the second leaf spring 2050 is arranged to connect the second interface 2020 to a second, opposite, side of the rigid element 2040, and whereby at least one of the leaf springs has a longitudinal axis 2060 that is inclined over a non-zero angle relative to a support direction of the elastic support device, in particular the Z-direction as shown.

It has been observed by the inventor that, by a suitable choice of the non-zero angle of the longitudinal axis of the leaf spring relative to the support direction, the parasitic deformation which occurs when the object 1800 is displaced in the horizontal direction relative to the base frame 1810 can be mitigated or alleviated.

In the embodiment as shown, both leaf springs 2030 and 2050 are inclined, i.e. have their longitudinal axis 2060 inclined, relative to the support direction over a non-zero angle α. It has been observed that, for a given blade and a required horizontal displacement of the object 1800 relative to the base frame 1810, an angle α can be determined which substantially alleviates the parasitic displacement that would occur. For the above given example of a blade having a length of approx. 400 mm and a required horizontal displacement of approx. 40 mm, it has been observed that by selecting an inclination of 0.09 degrees, or 1.62 mrad, the parasitic deformation, i.e. the increased vertical displacement of approx. 20 μm, can be substantially alleviated. As such, when the mentioned inclination is applied, the object 1800 can be made to displace along a substantially straight line when displaced in the horizontal plane, rather than following a parabolic-like trajectory.

In a preferred embodiment of the present invention, both leaf springs as applied in the blade according to the invention have substantially the same non-zero angle between the longitudinal axis and the support direction.

The blade according to the present invention as e.g. described above, may advantageously be applied in an elastic guiding device or positioning device according to the present invention. The application of the blade according to the invention in such a positioning device enables to mitigate or avoid the aforementioned parasitic deformation of the blade, and thus of the object that is positioned. Examples of objects that can be positioned using a positioning device according to the invention include stages, sensors, balance masses or masses in general.

In an embodiment, the positioning device according to the present invention can e.g. have a balance mass arrangement to reduce a transfer of reaction forces from an actuator of the positioning device to a reference or reference frame. In such embodiment, the positioning device may further comprise a support device to support the balance mass, whereby the support device comprises at least one elastic guiding device including a blade according to the invention.

Advantageously, such a positioning device may be applied in a lithographic apparatus or other apparatuses such as inspection apparatuses, e.g. particle beam apparatuses. As an example of the latter, an electron beam inspection apparatus can be mentioned. In such an electron beam inspection apparatus, the positioning device may thus include a balance mass and support device for supporting the balance mass.

Hereinabove different embodiments of elastic guiding devices, such as leaf spring devices, are described that are constructed to provide a relatively high stiffness in z-direction, e.g. vertical direction, to support a mass in combination with a relatively low stiffness in x-direction to allow movements in this horizontal direction. The elastic guiding devices are described with respect to the support of a balance mass of a positioning device, for example a positioning device to position a substrate in a lithographic apparatus. The elastic guiding devices may also be used to support any other mass, when a relatively large stiffness in a first direction, e.g. the z-direction, and a relatively low stiffness in at least one other direction, e.g. the x-direction, is needed. Note that some of the embodiments as described also have a relatively low stiffness in the y-direction as well, to allow movements in this horizontal direction as well.

Further, a torsion reinforcement element 44 as described with respect to the embodiment of FIGS. 4 and 5 may also be applied in other embodiments of elastic guiding devices, for example in other embodiments shown and described in this application, to at least partially prevent torsion of the respective leaf spring element associated with such torsion reinforcement element.

Other aspects of the invention are set-out as in the following numbered clauses.

1. Elastic guiding device to support a mass with respect to a base in a support direction, comprising a first blade extending in a first plane, and a second blade extending in a second plane, wherein the first plane and the second plane both extend in the support direction, wherein a first side of the first blade is connected to the base and a second side of the first blade, opposite to the first side of the first blade, is connected to a first side of the second blade, and wherein a second side of the second blade, opposite to the first side of the second blade is connected to the mass, wherein the first blade comprises at least one rigid element and at least one leaf spring element, wherein the at least one leaf spring element extends over a complete length of the first blade in the support direction and wherein the second blade comprises at least one rigid element and at least one leaf spring element, wherein the at least one leaf spring element extends over a complete length of the second blade in the support direction, wherein the second side of the first blade is connected to the first side of the second blade by a cross flexure.

2. Elastic guiding device as stated in clause 1, wherein the cross flexure comprises a first leaf spring element and a second leaf spring element arranged in the first blade and a third leaf spring element in the second blade, wherein seen in the support direction, the third leaf spring element is arranged between the first leaf spring element and the second leaf spring element.

3. Elastic guiding device as stated in clause 1 or 2, wherein the first plane and the second plane are substantially perpendicular with respect to each other.

4. Elastic guiding device as stated in any of the clauses 1-3, wherein the support direction is a vertical direction.

5. Elastic guiding device as stated in any of the clauses 1-4, wherein the elastic guiding device comprises at least one torsion reinforcement element associated with one of the leaf spring elements and arranged to at least partially prevent torsion of the respective leaf spring element.

6. Elastic guiding device as stated in any of the clauses 1-5, wherein the leaf spring elements comprise in the support direction a bottom end and a top end, wherein at least one of the bottom end and a top end comprises a rounded recess to reduce stress peaks in the material of the leaf spring elements at the bottom end and top end, respectively.

7. Elastic guiding device to support a mass with respect to a base in a support direction, comprising a first blade extending in a first plane, and a second blade extending in a second plane, wherein the first plane and the second plane both extend in the support direction, wherein a first side of the first blade is connected to the base and a second side of the first blade, opposite to the first side of the first blade, is connected to a first side of the second blade, and wherein a second side of the second blade, opposite to the first side of the second blade is connected to the mass, wherein at least one of the first blade and the second blade comprises a first rigid element and a second rigid element, both extending in support direction over a complete length of the first blade and/or second blade, respectively, and at least two parallel leaf spring elements each extending between the first rigid element and the second rigid element.

8. Elastic guiding device as stated in clause 7, wherein the first blade and comprises the first rigid element and the second rigid element, both extending in support direction over a complete length of the first blade, and at least two first leaf spring elements each extending between the first rigid element and the second rigid element, and wherein the second blade comprise a third rigid element and a fourth rigid element, both extending in support direction over a complete length of the second blade, and at least two second leaf spring elements each extending between the third rigid element and the fourth rigid element.

9. Elastic guiding device as stated in clause 7 or 8, wherein the second side of the first blade is connected to the first side of the second blade by a notch flexure extending in the support direction.

10. Elastic guiding device as stated in any of the clauses 7-9, wherein the first plane and the second plane are substantially perpendicular with respect to each other.

11. Elastic guiding device as stated in any of the clauses 7-10, wherein the support direction is a vertical direction.

12. Elastic guiding device as stated in any of the clauses 7-11, wherein the elastic guiding device comprises at least one torsion reinforcement element associated with one of the leaf spring elements and arranged to at least partially prevent torsion of the respective leaf spring element.

13. Elastic guiding device as stated in any of the clauses 7-12, wherein the leaf spring elements comprise in the support direction a bottom end and a top end, wherein at least one of the bottom end and a top end comprises a rounded recess to reduce stress peaks in the material of the leaf spring elements at the bottom end and top end, respectively.

14. Elastic guiding device to support a mass with respect to a base in a support direction, comprising at least one leaf spring element, wherein the at least one leaf spring element extends in the support direction, wherein the at least one leaf spring element comprises in the support direction a bottom end and a top end, wherein at least one of the bottom end and the top end comprises a rounded recess to reduce stress peaks in the material of the at least one leaf spring element at the bottom end and top end, respectively.

15. The elastic guiding device according to any of the preceding clauses, wherein the at least one of the leaf spring element has a cross-section perpendicular to the support direction, wherein the cross-section has a center part and two end parts, wherein the center part is in between the two end parts, wherein the center part is thinner than the two end parts.

16. The elastic guiding device of clause 15, wherein the center part is curved.

17. The elastic guiding device of clause 16, wherein the center part is curved in a shape of part of a circle, a parabola or an ellipse.

18. The elastic guiding device of any of the preceding clauses, wherein at least one of the leaf spring elements is divided into a plurality of sub-elements, wherein the sub-elements are arranged along the support direction and wherein the sub-element are separated from each other along the support direction.

19. The elastic guiding device of clause 18, wherein the at least one of the leaf spring element is divided into 3 sub-elements.

20. Elastic guiding device to support a mass with respect to a base in a support direction, comprising
  a supporting rod extending in a support direction,
  an intermediate support element, wherein an upper end of the supporting rod is connected to the mass and a lower end of the supporting rod is supported on the intermediate support element, and
  a suspension device mounted on the base and arranged to suspend the intermediate support element and to allow movement of the intermediate support element in at least a first direction perpendicular to the support direction.

21. Elastic guiding device as stated in clause 20, wherein the suspension device is arranged to allow movement of the intermediate support element in at least a second direction perpendicular to both the first direction and the support direction.

22. Elastic guiding device as stated in clause 20 or 21, wherein the upper end of the supporting rod comprises a first notch flexure extending in a first direction perpendicular to the support direction.

23. Elastic guiding device as stated in clause 22, wherein the upper end of the supporting rod comprises a second notch flexure extending in a second direction perpendicular to both the first direction and the support direction.

24. Elastic guiding device as stated in any of the clauses 20-23, wherein the support direction is a vertical direction.

25. A positioning device configured to displace an object, comprising:
  a stage to support the object,
  an actuator to move the stage with respect to a reference in a direction of movement,
  a balance mass arranged between the actuator and the reference to reduce transfer of reaction forces from the actuator to the reference,
  a support device arranged between the reference and the balance mass to support the balance mass, wherein the support device comprises at least one elastic guiding device as stated in any of the preceding clauses.

26. A lithographic apparatus comprising the positioning device of the clause 25.

27. A blade, for use in an elastic support device, the blade extending in a plane and comprising:
  a first interface for connecting the blade to a first structure;
  a second interface for connecting the blade to a second structure;
  a first leaf spring element, a rigid element and a second leaf spring element,
    whereby the first leaf spring is arranged to connect the first interface to a first side of the rigid element,
    whereby the second leaf spring is arranged to connect the second interface to a second, opposite, side of the rigid element, and
  whereby at least one of the leaf springs has a longitudinal axis that is inclined over a non-zero angle relative to a support direction of the elastic support device.

28. The blade according to clause 27, whereby both leaf springs are inclined about the same non-zero angle.

29. The blade according to clause 27 or 28, whereby the non-zero angle is configured to at least partially compensate a parasitic deformation of the blade.

30. The blade according to clause 29, wherein the parasitic deformation of the blade comprises a deformation of the blade in the support direction when the first structure is displaced relative to the second structure in a direction perpendicular to the plane.

31. Elastic guiding device to support a mass with respect to a base in a support direction, the elastic guiding device comprising at least one blade according to any of the clauses 27 to 30, whereby the base comprises the first structure and the mass comprises the second structure.

32. A positioning device configured to displace an object, comprising:
  a stage to support the object,
  an actuator to move the stage with respect to a reference in a direction of movement,
  a balance mass arranged between the actuator and the reference to reduce
  transfer of reaction forces from the actuator to the reference,
  a support device arranged between the reference and the balance mass to support the balance
  mass, wherein the support device comprises at least one elastic guiding device as stated in clause 31.

33. A particle beam apparatus comprising a positioning device according to clause 32.

34. The particle beam apparatus according to clause 33, wherein the particle beam apparatus is an electron beam apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An elastic guiding device configured to support a mass with respect to a base in a support direction, comprising:
a first blade extending in a first plane; and
a second blade extending in a second plane,
wherein the first plane and the second plane both extend in the support direction,
wherein a first side of the first blade is connected to the base and a second side of the first blade, opposite to the first side of the first blade, is connected to a first side of the second blade,
wherein a second side of the second blade, opposite to the first side of the second blade is connected to the mass,
wherein the first blade comprises at least one rigid element and at least one leaf spring element,
wherein the at least one leaf spring element extends over a complete length of the first blade in the support direction,
wherein the second blade comprises at least one rigid element and at least one leaf spring element,
wherein the at least one leaf spring element extends over a complete length of the second blade in the support direction, and
wherein the second side of the first blade is connected to the first side of the second blade by a cross flexure.

2. The elastic guiding device of claim 1, wherein:
the cross flexure comprises a first leaf spring element and a second leaf spring element arranged in the first blade and a third leaf spring element in the second blade, and
seen in the support direction, the third leaf spring element is arranged between the first leaf spring element and the second leaf spring element.

3. The elastic guiding device of claim 1, wherein the first plane and the second plane are substantially perpendicular with respect to each other.

4. The elastic guiding device of claim 1, wherein the support direction is a vertical direction.

5. The elastic guiding device of claim 1, wherein the elastic guiding device comprises at least one torsion reinforcement element associated with one of the leaf spring elements and is arranged to at least partially prevent torsion of the respective leaf spring element.

6. The elastic guiding device of claim 1, wherein:
the leaf spring elements comprise, in the support direction, a bottom end and a top end, and
at least one of the bottom end and a top end comprises a rounded recess to reduce stress peaks in the material of the leaf spring elements at the bottom end and top end, respectively.

7. The elastic guiding device of claim 1, wherein:
the at least one of the leaf spring elements has a cross-section perpendicular to the support direction,
the cross-section has a center part and two end parts,
the center part is in between the two end parts, and
the center part is thinner than the two end parts.

8. The elastic guiding device of claim 7, wherein the center part is curved.

9. The elastic guiding device of claim 8, wherein the center part is curved in a shape of part of a circle, a parabola or an ellipse.

10. The elastic guiding device of claim 1, wherein:
at least one of the leaf spring elements is divided into a plurality of sub-elements,
the sub-elements are arranged along the support direction, and
the sub-elements are separated from each other along the support direction.

11. The elastic guiding device of claim 10, wherein the at least one of the leaf spring elements is divided into 3 sub-elements.

12. A positioning device configured to displace an object, comprising:
a stage configured to support the object;
an actuator configured to move the stage with respect to a reference in a direction of movement;
a balance mass arranged between the actuator and the reference and configured to reduce transfer of reaction forces from the actuator to the reference; and
a support device arranged between the reference and the balance mass and configured to support the balance mass,
wherein the support device comprises at least one elastic guiding device to support the balance mass with respect to a base in a support direction, comprising:
a first blade extending in a first plane; and
a second blade extending in a second plane,
wherein the first plane and the second plane both extend in the support direction,
wherein a first side of the first blade is connected to the base and a second side of the first blade, opposite to the first side of the first blade, is connected to a first side of the second blade,
wherein a second side of the second blade, opposite to the first side of the second blade, is connected to the mass,
wherein the first blade comprises at least one rigid element and at least one leaf spring element,
wherein the at least one leaf spring element extends over a complete length of the first blade in the support direction,
wherein the second blade comprises at least one rigid element and at least one leaf spring element,
wherein the at least one leaf spring element extends over a complete length of the second blade in the support direction, and
wherein the second side of the first blade is connected to the first side of the second blade by a cross flexure.

13. A lithographic apparatus comprising a positioning device configured to displace an object, comprising:
a stage configured to support the object,
an actuator configured to move the stage with respect to a reference in a direction of movement,
a balance mass arranged between the actuator and the reference and configured to reduce transfer of reaction forces from the actuator to the reference, and
a support device arranged between the reference and the balance mass and configured to support the balance mass,
wherein the support device comprises at least one elastic guiding device to support the balance mass with respect to a base in a support direction, comprising a first blade extending in a first plane, and a second blade extending in a second plane,
wherein the first plane and the second plane both extend in the support direction,
wherein a first side of the first blade is connected to the base and a second side of the first blade, opposite to the first side of the first blade, is connected to a first side of the second blade,
wherein a second side of the second blade, opposite to the first side of the second blade is connected to the mass,
wherein the first blade comprises at least one rigid element and at least one leaf spring element, wherein the at least one leaf spring element extends over a complete length of the first blade in the support direction,
wherein the second blade comprises at least one rigid element and at least one leaf spring element,
wherein the at least one leaf spring element extends over a complete length of the second blade in the support direction, and
wherein the second side of the first blade is connected to the first side of the second blade by a cross flexure.

* * * * *